(12) United States Patent
Campbell et al.

(10) Patent No.: US 8,179,677 B2
(45) Date of Patent: May 15, 2012

(54) IMMERSION-COOLING APPARATUS AND METHOD FOR AN ELECTRONIC SUBSYSTEM OF AN ELECTRONICS RACK

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 123 days.

(21) Appl. No.: 12/825,756

(22) Filed: Jun. 29, 2010

(65) Prior Publication Data

US 2011/0315355 A1 Dec. 29, 2011

(51) Int. Cl.
*H05K 7/20* (2006.01)
(52) U.S. Cl. ....... 361/699; 361/700; 361/701; 165/80.4; 165/104.33; 174/15.1
(58) Field of Classification Search .................. None
See application file for complete search history.

(56) References Cited

U.S. PATENT DOCUMENTS

| | | |
|---|---|---|
| 2,125,888 A | 8/1938 | Cordrey |
| 2,512,545 A | 6/1950 | Hazard |
| 2,548,325 A | 4/1951 | Smith |
| 2,643,282 A | 6/1953 | Green |
| 2,791,888 A | 5/1957 | Vani |
| 3,109,485 A | 11/1963 | Fortier |
| 3,143,592 A | 8/1964 | August |
| 3,226,941 A | 1/1966 | Snelling |
| 3,404,730 A | 10/1968 | Kurisu |
| 3,476,175 A | 11/1969 | Plevyak |

(Continued)

FOREIGN PATENT DOCUMENTS

DE 10112389 A1 10/2002
(Continued)

OTHER PUBLICATIONS

Office Action for U.S. Appl. No. 12/256,623 (U.S. Patent Publication No. 2010/0101765 A1), dated Nov. 5, 2010.

(Continued)

*Primary Examiner* — Boris Chervinsky
(74) *Attorney, Agent, or Firm* — Dennis Jung, Esq.; Kevin P. Radigan, Esq.; Heslin Rothenberg Farley & Mesiti P.C.

(57) ABSTRACT

Cooling apparatus and method are provided for immersion-cooling of an electronic subsystem of an electronics rack. The cooling apparatus includes a housing at least partially surrounding and forming a sealed compartment about the electronic subsystem and a dielectric fluid disposed within the sealed compartment, with the electronic subsystem being immersed within the dielectric fluid. A liquid-cooled vapor condenser is provided which includes a plurality of thermally conductive condenser fins extending within the sealed compartment in an upper portion of the compartment. The condenser fins facilitate cooling of dielectric fluid vapor rising to the upper portion of the compartment. A filler material is disposed within the sealed compartment to reduce the amount of dielectric fluid required within the compartment to achieve immersion-cooling of the electronic subsystem, and the filler material includes a shaped surface to direct dielectric fluid vapor within the compartment towards the condenser fins.

20 Claims, 11 Drawing Sheets

U.S. PATENT DOCUMENTS

| | | | |
|---|---|---|---|
| 3,512,582 A | 5/1970 | Chu et al. | |
| 3,578,014 A | 5/1971 | Gachot | |
| 3,586,101 A | 6/1971 | Chu et al. | |
| 3,600,636 A | 8/1971 | Petersen | |
| 3,609,991 A | 10/1971 | Chu et al. | |
| 3,774,677 A | 11/1973 | Antonetti et al. | |
| 3,858,090 A | 12/1974 | Lehmann | |
| 4,064,300 A | 12/1977 | Bhangu | |
| 4,108,242 A | 8/1978 | Searight et al. | |
| 4,201,195 A | 5/1980 | Sakhuja | |
| 4,302,793 A | 11/1981 | Rohner | |
| 4,430,866 A | 2/1984 | Willitts | |
| 4,590,538 A | 5/1986 | Cray, Jr. | |
| 4,619,316 A | 10/1986 | Nakayama et al. | |
| 4,622,946 A | 11/1986 | Hurley et al. | |
| 4,694,378 A | 9/1987 | Nakayama et al. | |
| 4,704,658 A | 11/1987 | Yokouchi et al. | |
| 4,741,385 A | 5/1988 | Bergles et al. | |
| 4,750,086 A | 6/1988 | Mittal | |
| 4,912,600 A | 3/1990 | Jaeger et al. | |
| 4,928,206 A | 5/1990 | Porter et al. | |
| 4,928,207 A | 5/1990 | Chrysler et al. | |
| 4,962,444 A | 10/1990 | Niggemann | |
| 5,021,924 A | 6/1991 | Kieda et al. | |
| 5,057,968 A | 10/1991 | Morrison | |
| 5,063,476 A | 11/1991 | Hamadah et al. | |
| 5,067,047 A | 11/1991 | Azar | |
| 5,126,919 A | 6/1992 | Yamamoto et al. | |
| 5,168,348 A | 12/1992 | Chu et al. | |
| 5,183,104 A | 2/1993 | Novotny | |
| 5,220,804 A | 6/1993 | Tilton et al. | |
| 5,270,572 A | 12/1993 | Nakajima et al. | |
| 5,274,530 A | 12/1993 | Anderson | |
| 5,305,184 A | 4/1994 | Anderesen et al. | |
| 5,349,831 A | 9/1994 | Daikiku et al. | |
| 5,406,807 A | 4/1995 | Ashiwake et al. | |
| 5,414,592 A | 5/1995 | Stout et al. | |
| 5,458,185 A | 10/1995 | Mizuno | |
| 5,467,250 A | 11/1995 | Howard et al. | |
| 5,491,363 A | 2/1996 | Yoshikawa | |
| 5,675,473 A | 10/1997 | McDunn et al. | |
| 5,687,577 A | 11/1997 | Ballard et al. | |
| 5,718,117 A | 2/1998 | McDunn et al. | |
| 5,782,101 A | 7/1998 | Dennis | |
| 5,825,621 A | 10/1998 | Giannatto et al. | |
| 5,829,264 A | 11/1998 | Ishigaki et al. | |
| 5,854,092 A | 12/1998 | Root et al. | |
| 5,860,602 A | 1/1999 | Tilton et al. | |
| 5,864,466 A | 1/1999 | Remsburg | |
| 5,880,931 A | 3/1999 | Tilton et al. | |
| 5,907,473 A | 5/1999 | Przilas et al. | |
| 5,943,211 A | 8/1999 | Havey et al. | |
| 5,959,351 A | 9/1999 | Sasaki et al. | |
| 5,963,425 A | 10/1999 | Chrysler et al. | |
| 5,970,731 A | 10/1999 | Hare et al. | |
| 6,000,908 A | 12/1999 | Bunker | |
| 6,016,969 A | 1/2000 | Tilton et al. | |
| 6,019,167 A | 2/2000 | Bishop et al. | |
| 6,026,565 A | 2/2000 | Giannatto et al. | |
| 6,052,284 A | 4/2000 | Suga et al. | |
| 6,055,157 A | 4/2000 | Bartilson | |
| 6,139,361 A | 10/2000 | Przilas et al. | |
| 6,173,577 B1 | 1/2001 | Gold | |
| 6,193,905 B1 | 2/2001 | Yamada et al. | |
| 6,205,799 B1 | 3/2001 | Patel et al. | |
| 6,212,895 B1 | 4/2001 | Richardson | |
| 6,243,268 B1 * | 6/2001 | Kang et al. | 361/715 |
| 6,320,744 B1 | 11/2001 | Sullivan et al. | |
| 6,349,554 B2 | 2/2002 | Patel et al. | |
| 6,366,462 B1 | 4/2002 | Chu et al. | |
| 6,378,605 B1 | 4/2002 | Kutscher et al. | |
| 6,392,891 B1 | 5/2002 | Tzlil et al. | |
| 6,393,853 B1 | 5/2002 | Vukovic et al. | |
| 6,404,640 B1 | 6/2002 | Ishimine et al. | |
| 6,431,260 B1 | 8/2002 | Agonafer et al. | |
| 6,457,321 B1 | 10/2002 | Patel et al. | |
| 6,462,941 B1 | 10/2002 | Hulick et al. | |
| 6,519,151 B2 | 2/2003 | Chu et al. | |
| 6,536,510 B2 | 3/2003 | Khrustalev et al. | |
| 6,571,569 B1 | 6/2003 | Rini et al. | |
| 6,574,104 B2 | 6/2003 | Patel et al. | |
| 6,581,388 B2 | 6/2003 | Novotny et al. | |
| 6,616,469 B2 | 9/2003 | Goodwin et al. | |
| 6,621,707 B2 | 9/2003 | Ishimine et al. | |
| 6,644,058 B2 | 11/2003 | Bash et al. | |
| 6,646,879 B2 | 11/2003 | Pautsch | |
| 6,708,515 B2 * | 3/2004 | Malone et al. | 62/259.2 |
| 6,807,056 B2 | 10/2004 | Kondo et al. | |
| 6,817,196 B2 | 11/2004 | Malone et al. | |
| 6,828,675 B2 | 12/2004 | Memory et al. | |
| 6,927,980 B2 | 8/2005 | Fukuda et al. | |
| 6,955,062 B2 | 10/2005 | Tilton et al. | |
| 6,973,801 B1 | 12/2005 | Campbell et al. | |
| 6,976,528 B1 | 12/2005 | Tilton et al. | |
| 7,011,143 B2 | 3/2006 | Corrado et al. | |
| 7,012,807 B2 | 3/2006 | Chu et al. | |
| 7,057,893 B2 | 6/2006 | Nicolai et al. | |
| 7,079,393 B2 | 7/2006 | Colgan et al. | |
| 7,088,585 B2 | 8/2006 | Chu et al. | |
| 7,104,078 B2 | 9/2006 | Tilton | |
| 7,106,590 B2 | 9/2006 | Chu et al. | |
| 7,134,289 B2 | 11/2006 | Patel et al. | |
| 7,143,605 B2 | 12/2006 | Rohrer et al. | |
| 7,187,549 B2 | 3/2007 | Teneketges | |
| 7,191,954 B2 | 3/2007 | Kline | |
| 7,222,502 B2 | 5/2007 | Kobayashi et al. | |
| 7,233,491 B2 | 6/2007 | Faneuf et al. | |
| 7,251,139 B2 | 7/2007 | Bhattacharya et al. | |
| 7,252,100 B1 | 8/2007 | Downes et al. | |
| 7,258,161 B2 | 8/2007 | Cosley et al. | |
| 7,272,005 B2 | 9/2007 | Campbell et al. | |
| 7,285,851 B1 | 10/2007 | Cepeda-Rizo et al. | |
| 7,286,356 B2 | 10/2007 | Keenan et al. | |
| 7,295,436 B2 | 11/2007 | Cheon | |
| 7,295,440 B2 | 11/2007 | Ganev et al. | |
| 7,309,209 B2 | 12/2007 | Amiot et al. | |
| 7,349,213 B2 | 3/2008 | Campbell et al. | |
| 7,355,852 B2 | 4/2008 | Pfahnl | |
| 7,362,574 B2 | 4/2008 | Campbell et al. | |
| 7,365,973 B2 | 4/2008 | Rasmussen et al. | |
| 7,372,698 B1 | 5/2008 | Tilton et al. | |
| 7,375,962 B2 | 5/2008 | Campbell et al. | |
| 7,380,409 B2 | 6/2008 | Campbell et al. | |
| 7,385,810 B2 | 6/2008 | Chu et al. | |
| 7,392,660 B2 | 7/2008 | Tilton et al. | |
| 7,392,823 B2 | 7/2008 | Dong et al. | |
| 7,400,505 B2 | 7/2008 | Campbell et al. | |
| 7,403,392 B2 | 7/2008 | Attlesey et al. | |
| 7,408,776 B2 | 8/2008 | Campbell et al. | |
| 7,414,845 B2 | 8/2008 | Attlesey et al. | |
| 7,420,808 B2 | 9/2008 | Campbell et al. | |
| 7,428,151 B2 | 9/2008 | Sonnabend et al. | |
| 7,436,666 B1 | 10/2008 | Konshak | |
| 7,450,384 B2 | 11/2008 | Tavassoli et al. | |
| 7,450,385 B1 | 11/2008 | Campbell et al. | |
| 7,466,549 B2 | 12/2008 | Dorrich et al. | |
| 7,477,513 B1 | 1/2009 | Cader et al. | |
| 7,477,514 B2 | 1/2009 | Campbell et al. | |
| 7,495,914 B2 | 2/2009 | Tilton et al. | |
| 7,531,142 B2 | 5/2009 | Huziwara et al. | |
| 7,559,207 B2 | 7/2009 | Knight et al. | |
| 7,561,425 B2 * | 7/2009 | Mindock et al. | 361/700 |
| 7,602,608 B2 | 10/2009 | Tilton et al. | |
| 7,609,518 B2 | 10/2009 | Hopton et al. | |
| 7,630,795 B2 | 12/2009 | Campbell et al. | |
| 7,639,499 B1 | 12/2009 | Campbell et al. | |
| 7,641,101 B2 | 1/2010 | Campbell et al. | |
| 7,654,100 B2 | 2/2010 | Rini et al. | |
| 7,660,109 B2 | 2/2010 | Iyengar et al. | |
| 7,661,463 B2 * | 2/2010 | Liu | 165/104.14 |
| 7,724,524 B1 | 5/2010 | Campbell et al. | |
| 8,014,150 B2 * | 9/2011 | Campbell et al. | 361/700 |
| 2002/0062945 A1 | 5/2002 | Hocker et al. | |
| 2003/0230401 A1 | 12/2003 | Pfister et al. | |
| 2004/0008490 A1 | 1/2004 | Cheon | |
| 2004/0057211 A1 | 3/2004 | Kondo et al. | |
| 2005/0207116 A1 | 9/2005 | Yatskov et al. | |

| | | | |
|---|---|---|---|
| 2005/0241802 A1 | 11/2005 | Malone et al. |
| 2005/0244280 A1 | 11/2005 | Malone et al. |
| 2005/0254214 A1 | 11/2005 | Salmon |
| 2006/0126296 A1 | 6/2006 | Campbell et al. |
| 2006/0162365 A1 | 7/2006 | Hoang et al. |
| 2006/0180300 A1 | 8/2006 | Lenehan et al. |
| 2007/0025081 A1 | 2/2007 | Berlin et al. |
| 2007/0035937 A1 | 2/2007 | Colbert et al. |
| 2007/0121295 A1 | 5/2007 | Campbell et al. |
| 2007/0159797 A1 | 7/2007 | Teneketges |
| 2007/0193300 A1 | 8/2007 | Tilton et al. |
| 2007/0199204 A1 | 8/2007 | Knight et al. |
| 2007/0199340 A1 | 8/2007 | Knight et al. |
| 2007/0201210 A1 | 8/2007 | Chow et al. |
| 2007/0227710 A1 | 10/2007 | Belady et al. |
| 2007/0291452 A1 | 12/2007 | Gilliland et al. |
| 2007/0295480 A1 | 12/2007 | Campbell et al. |
| 2007/0297136 A1 | 12/2007 | Konshak |
| 2008/0002363 A1 | 1/2008 | Campbell et al. |
| 2008/0018212 A1 | 1/2008 | Spearing et al. |
| 2008/0024991 A1 | 1/2008 | Colbert et al. |
| 2008/0062639 A1 | 3/2008 | Campbell et al. |
| 2008/0123297 A1 | 5/2008 | Tilton et al. |
| 2008/0158818 A1 | 7/2008 | Clidaras et al. |
| 2008/0196868 A1 | 8/2008 | Attlesey et al. |
| 2008/0209931 A1 | 9/2008 | Stevens |
| 2008/0225478 A1 | 9/2008 | Goettert et al. |
| 2009/0080173 A1 | 3/2009 | Schmidt et al. |
| 2009/0086428 A1 | 4/2009 | Campbell et al. |
| 2009/0086432 A1 | 4/2009 | Campbell et al. |
| 2009/0126909 A1 | 5/2009 | Ellsworth, Jr. et al. |
| 2009/0126910 A1 | 5/2009 | Campbell et al. |
| 2009/0133866 A1 | 5/2009 | Campbell et al. |
| 2009/0238235 A1 | 9/2009 | Campbell et al. |
| 2009/0260777 A1 | 10/2009 | Attlesey |
| 2009/0268404 A1 | 10/2009 | Chu et al. |
| 2009/0314467 A1 | 12/2009 | Campbell et al. |
| 2009/0316360 A1 | 12/2009 | Campbell et al. |
| 2010/0101759 A1 | 4/2010 | Campbell et al. |
| 2010/0101765 A1 | 4/2010 | Campbell et al. |
| 2010/0103614 A1 | 4/2010 | Campbell et al. |
| 2010/0103618 A1 | 4/2010 | Campbell et al. |
| 2010/0103620 A1 | 4/2010 | Campbell et al. |
| 2010/0246118 A1 | 9/2010 | Attlesey |

FOREIGN PATENT DOCUMENTS

| | | |
|---|---|---|
| JP | 8-254512 A | 10/1996 |
| JP | 2002-374086 | 12/2002 |
| WO | 2009131810 | 10/2009 |

OTHER PUBLICATIONS

Notice of Allowance for U.S. Appl. No. 12/256,618 (U.S. Publication No. 2010/0101759 A1), dated Feb. 10, 2011.

Hwang, U., "Heat Exchanger for Vapor Condensation by Dropwise Technique", IBM Technical Disclosure Bulletin, Publication No. IPCOM000089717D (Dec. 1, 1977).

Chu et al., "Dielectric Fluidized Cooling System", IBM Technical Disclosure Bulletin, Publication No. IPCOM000088682D (Jul. 1, 1977).

Oktay et al., "Subcooled Flow Boiling with Flow Pattern Control", IBM Technical Disclosure Bulletin, Publication No. IPCOM000067827D (Oct. 1, 1979).

Hwang et al., "Evaporation Cooling Module", IBM Technical Disclosure Bulletin, Publication No. IPCOM000066472D (Mar. 1, 1979).

Campbell et al., "Suspended Integrated Manifold System with Serviceability for large Planar Arrays of Electronic Modules", IBM Technical Disclosure, Publication No. IPCOM000126455D (Jul. 18, 2005).

International Application No. PCT/EP2009/060792, filed Aug. 20, 2009. Notification of International Search Report, dated Dec. 23, 2009.

Chee, B., "Supermicro Water Cooled Blades", Info World, Geeks in Paradise, (Mar. 5, 2008), http://weblog.infoworld.com/geeks/archives/2008/03.

D. Delia et al., "System Cooling Design for the Water-Cooled IBM Enterprise System/900 Processors", IBM Journal of Research and Development, vol. 36, No. 4 pp. 791-803 (Jul. 1992).

Miyahara, M., "Small Fans for Cooling Small Electronic Devices", Electronics Cooling Magazine, online article retrieved from http://electronics-cooling.com/html/2009_may_techbrief.php (Aug. 31, 2009).

Nelson et al., "Thermal Performance of an Integral Immersion Cooled Multi-Chip Module Package", IEEE Transactions on Components, Packaging and Manufacturing Technology, Part A, vol. 17, No. 3 (Sep. 1994).

Zamanabadi et al., "Hybrid Control Challenges in Refrigeration Systems", Danfoss A/A, Denmark, Advanced Engineering—Refrigeration and Air Conditioning, EECI (2007).

Campbell et al., "Condenser Fin Structures Facilitating Vapor Condensation Cooling of Coolant", U.S. Appl. No. 12/491,286, filed Jun. 25, 2009.

Campbell et al., "Condenser Structures with Fin Cavities Facilitating Vapor Condensation Cooling of Coolant", U.S. Appl. No. 12/491,287, filed Jun. 25, 2009.

Campbell et al., "Apparatus and Method for Adjusting Coolant Flow Resistance Through Liquid-Cooled Electronics Rack(s)", U.S. Appl. No. 12/556,040, filed Sep. 9, 2009.

Campbell et al., "Apparatus and Method with Forced Coolant Vapor Movement for Facilitating Two-Phase Cooling of an Electric Device", U.S. Appl. No. 12/565,175, filed Sep. 23, 2009.

Campbell et al., "Liquid-Cooled Electronics Apparatus and Methods of Fabrication", U.S. Appl. No. 12/556,081, filed Sep. 24, 2009.

Campbell et al., "Compliant Conduction Rail Assembly and Method Facilitating Cooling of an Electronics Structure", U.S. Appl. No. 12/570,215, filed Sep. 30, 2009.

Campbell et al., "Cooled Electronic Module with Pump-Enhanced, Dielectric Fluid Immersion-Cooling", U.S. Appl. No. 12/491,281, filed Jun. 25, 2009.

Campbell et al., "System and Method for Standby Mode Cooling of a Liquid-Cooled Electronics Rack", U.S. Appl. No. 12/567,954, filed Sep. 28, 2009.

Campbell et al., "Cooling System and Method Minimizing Power Consumption in Cooling Liquid-Cooled Electronics Racks", U.S. Appl. No. 12/556,066, filed Sep. 9, 2009.

RD 323064 A, Mar. 10, 1991, English Document.

Office Action for U.S. Appl. No. 12/256,631 (U.S. Patent Publication No. 2010-0103614 A1 ), dated Apr. 21, 2010.

Office Action for U.S. Appl. No. 12/256,628 (U.S. Patent Publication No. 2010-0103618 A1 ), dated Aug. 5, 2010.

Office Action for U.S. Appl. No. 12/256,605 (U.S. Patent Publication No. 2010/0103620 A1), dated Aug. 10, 2010.

Campbell et al., "Liquid-Cooled Electronics Rack with Immersion-Cooled Electronic Subsystems and Vertically-Mounted, Vapor-Condensing Unit", U.S. Appl. No. 12/825,745, filed Jun. 29, 2010.

Campbell et al., "Interleaved, Immersion-Cooling Apparatus and Method for an Electronic Subsystem of an Electronics Rack", U.S. Appl. No. 12/825,761, filed Jun. 29, 2010.

Campbell et al., "Interleaved, Immersion-Cooling Apparatuses and Methods for Cooling Electronic Subsystems", U.S. Appl. No. 12/825,776, filed Jun. 29, 2010.

Campbell et al., "Liquid-Cooled Electronics Rack with Immersion-Cooled Electronic Subsystems", U.S. Appl. No. 12/825,781, filed Jun. 29, 2010.

Office Action for U.S. Appl. No. 12/256,618 (U.S. Patent Publication No. 2010/0101759 A1), dated Aug. 30, 2010.

Campbell et al., Notice of Allowance for U.S. Appl. No. 12/825,781, filed Jun. 29, 2010 (U.S. Patent Publication No. 2011/0317367 A1), dated Jan. 20, 2012.

Campbell et al., Notice of Allowance for U.S. Appl. No. 12/985,552, filed Jan. 6, 2011 (U.S. Patent Publication No. 2011/0103019 A1), dated Feb. 16, 2012.

* cited by examiner

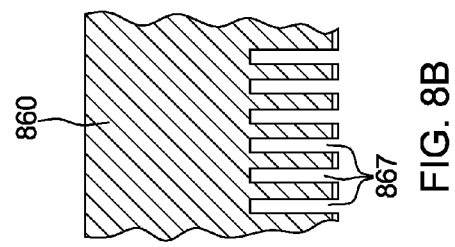
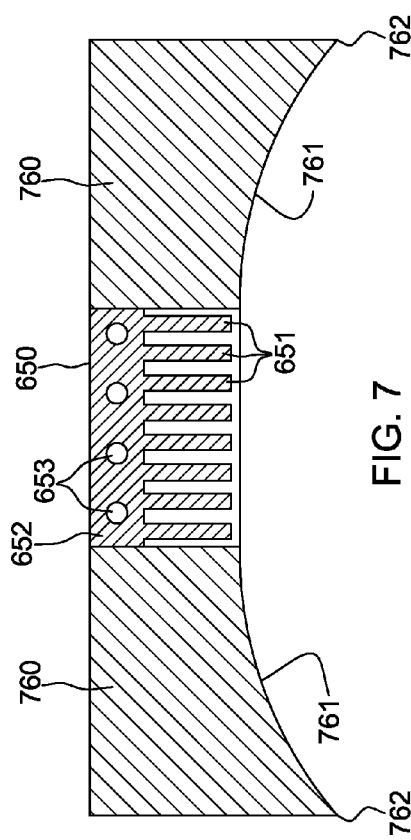
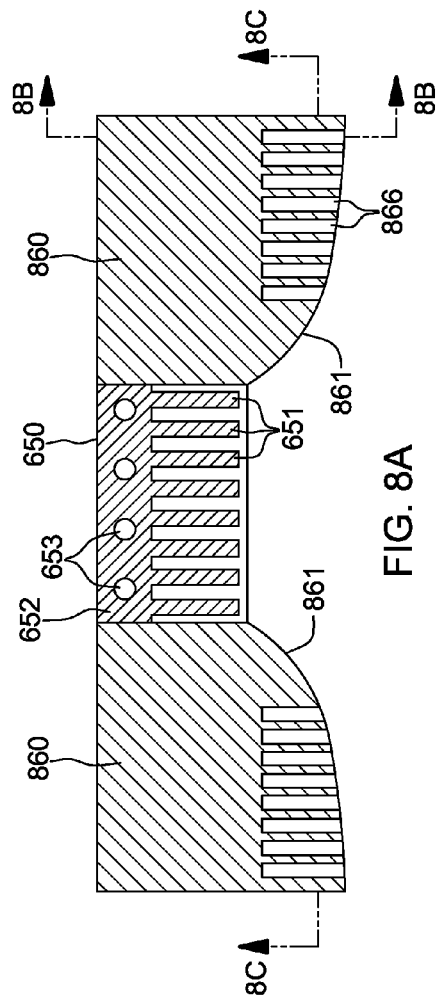

IMMERSION-COOLING APPARATUS AND METHOD FOR AN ELECTRONIC SUBSYSTEM OF AN ELECTRONICS RACK

BACKGROUND

The present invention relates in general to apparatuses and methods for facilitating cooling of rack-mounted assemblages of individual electronic units, such as rack-mounted computer server units.

The power dissipation of integrated circuit chips, and the modules containing the chips, continues to increase in order to achieve increases in processor performance. This trend poses cooling challenges at the module, subsystem and system levels.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer or subsystem by providing greater airflow, for example, through the use of a more powerful air moving device or by increasing the rotational speed (i.e., RPMs) of an existing air moving device. However, this approach is becoming problematic, particularly in the context of a computer center installation (i.e., data center).

The sensible heat load carried by the air exiting the rack is stressing the availability of the room air-conditioning to effectively handle the load. This is especially true for large installations with "server farms" or large banks of computer racks close together. In such installations, liquid cooling is an attractive technology to manage the higher heat fluxes. The liquid absorbs the heat dissipated by the components/modules in an efficient manner. Typically, the heat is ultimately transferred from the liquid to an outside environment, whether air or other liquid coolant.

BRIEF SUMMARY

The shortcomings of the prior art are overcome and additional advantages are provided through the provision of a cooling apparatus comprising a housing configured to at least partially surround and form a sealed compartment about an electronic subsystem comprising a plurality of electronic components to be cooled. A dielectric fluid is disposed within the sealed compartment and the electronic subsystem's plurality of electronic components to be cooled are immersed within the dielectric fluid. The cooling apparatus further includes a liquid-cooled vapor condenser, which includes a plurality of thermally conductive condenser fins extending within the sealed compartment in an upper portion of the sealed compartment. The plurality of thermally conductive condenser fins facilitate cooling and condensing of dielectric fluid vapor rising to the upper portion of the sealed compartment. In addition, the cooling apparatus includes a filler material disposed within the sealed compartment for reducing an amount of dielectric fluid required within the sealed compartment for immersion of the electronic subsystem's plurality of electronic components within the dielectric fluid. The filler material includes a shaped surface configured to direct dielectric fluid vapor within the sealed compartment towards the plurality of thermally conductive condenser fins.

In another aspect, a liquid-cooled electronics rack is provided. The liquid-cooled electronics rack includes: an electronics rack, comprising an electronic subsystem including a plurality of electronic components to be cooled, and a cooling apparatus for immersion-cooling of the plurality of electronic components of the electronic subsystem. The cooling apparatus includes a housing at least partially surrounding and forming a sealed compartment about the electronic subsystem and a dielectric fluid disposed within the sealed compartment, wherein the electronic subsystem's plurality of electronic components are immersed within the dielectric fluid. The cooling apparatus further includes a liquid-cooled vapor condenser, which includes a plurality of thermally conductive condenser fins extending within the sealed compartment in an upper portion of the sealed compartment. The plurality of thermally conductive condenser fins facilitate cooling and condensing of dielectric fluid vapor rising to the upper portion of the sealed compartment. In addition, the cooling apparatus includes a filler material disposed within the sealed compartment and reducing an amount of dielectric fluid required within the sealed compartment to achieve immersion of the electronic subsystem's plurality of electronic components within the dielectric fluid. The filler material includes a shaped surface configured to direct dielectric fluid vapor within the sealed compartment towards the plurality of thermally conductive condenser fins.

In a further aspect, a method of facilitating cooling of an electronic subsystem is provided. The method includes: providing a housing at least partially surrounding and forming a sealed compartment about the electronic subsystem, the electronic subsystem including a plurality of electronic components to be cooled; immersing the electronic subsystem's plurality of electronic components within a dielectric fluid within the sealed compartment; providing a liquid-cooled vapor condenser comprising a plurality of thermally conductive condenser fins extending within the sealed compartment in an upper portion of the sealed compartment, the plurality of thermally conductive condenser fins facilitating cooling and condensing of dielectric fluid vapor rising to the upper portion of the sealed compartment; and disposing a filler material within the sealed compartment to reduce an amount of dielectric fluid required within the sealed compartment to achieve immersion of the electronic subsystem's plurality of electronic components within the dielectric fluid, the filler material comprising a shaped surface, and the shaped surface being configured to direct dielectric fluid within the sealed compartment towards the plurality of thermally conductive condenser fins, wherein at least a portion of the shaped surface of the filler material is covered by the dielectric fluid within the sealed compartment.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 7 is a cross-sectional elevational view of an alternate embodiment of a liquid-cooled vapor condenser and filler material subassembly of a cooling apparatus, in accordance with an aspect of the present invention;

FIG. 8A is a cross-sectional elevational view of another embodiment of a liquid-cooled vapor condenser and filler material subassembly of a cooling apparatus, in accordance with an aspect of the present invention;

FIG. 8B is a partial cross-sectional elevational view of the liquid-cooled vapor condenser and filler material subassembly of FIG. 8A, taken along line 8B-8B thereof, in accordance with an aspect of the present invention;

DETAILED DESCRIPTION

Figure 1:
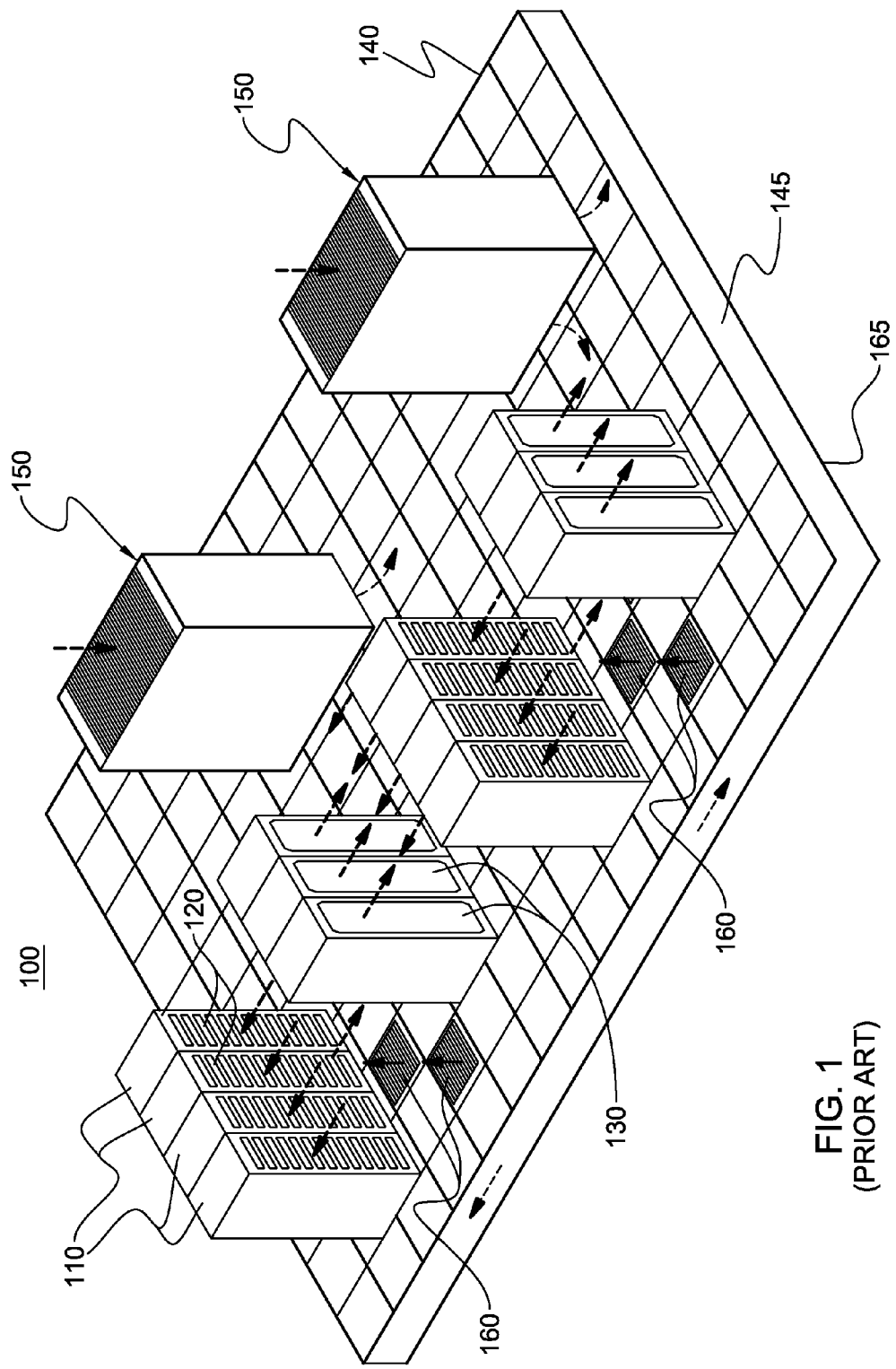
FIG. 1 depicts one embodiment of a conventional raised floor layout of an air-cooled computer installation.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronic system, and may be, for example, a stand alone computer processor having high, mid or low end processing capability. In one embodiment, an electronics rack may comprise one or more electronic subsystems, each having one or more heat generating components disposed therein requiring cooling. "Electronic subsystem" refers to any sub-housing, blade, book, drawer, node, compartment, board, etc., having multiple heat generating electronic components disposed therein or thereon. Each electronic subsystem of an electronics rack may be movable or fixed relative to the electronics rack, with the rack-mounted electronic drawers of a rack unit and blades of a blade center system being two examples of subsystems of an electronics rack to be cooled. In one embodiment, electronic subsystem refers to an electronic system which comprises multiple different types of electronic components, and may be, in one example, a server unit.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier. Further, unless otherwise specified herein, the terms "liquid-cooled cold plate" and "liquid-cooled base plate" each refer to any conventional thermally conductive structure having a plurality of channels or passageways formed therein for flowing of liquid-coolant therethrough. In addition, "metallurgically bonded" refers generally herein to two components being welded, brazed or soldered together by any means.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a brine, a dielectric liquid, a fluorocarbon liquid, a liquid metal, or other similar coolant, or refrigerant, while still maintaining the advantages and unique features of the present invention.

Reference is made below to the drawings (which are not drawn to scale for ease of understanding), wherein the same reference numbers used throughout different figures designate the same or similar components.

As shown in FIG. 1, in a raised floor layout of an air-cooled computer installation 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air-moving devices (e.g., fans or blowers) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the computer installation 100. Room air is taken into each air conditioning unit 150 near an upper portion thereof. This room air comprises in part exhausted air from the "hot" aisles of the computer installation defined by opposing air outlet sides 130 of the electronics racks 110.

Figure 2:
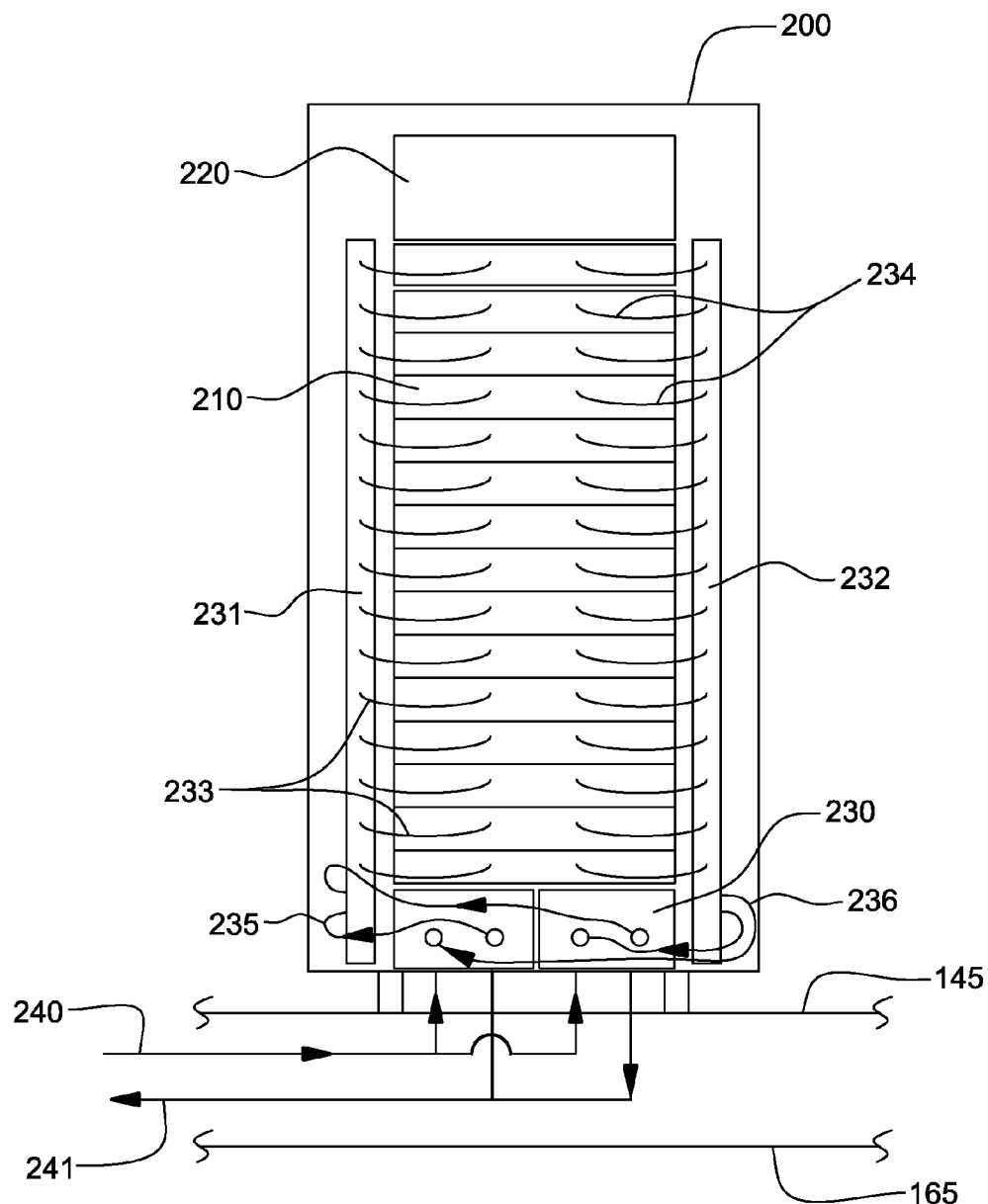
FIG. 2 is a front elevational view of one embodiment of a liquid-cooled electronics rack comprising multiple electronic subsystems to be cooled via a cooling apparatus, in accordance with an aspect of the present invention.

FIG. 2 depicts one embodiment of a liquid-cooled electronics rack 200, which may comprise a cooling apparatus such as described herein below. In one embodiment, liquid-cooled electronics rack 200 comprises a plurality of electronic subsystems 210, which may be processor or server nodes (in one embodiment). A bulk power assembly 220 is disposed at an upper portion of liquid-cooled electronics rack 200, and two modular cooling units (MCUs) 230 are positioned in a lower portion of the liquid-cooled electronics rack for providing system coolant to the electronic subsystems. In the embodiments described herein, the system coolant is assumed to be water or an aqueous-based solution, by way of example only.

In addition to MCUs 230, the cooling apparatus includes a system coolant supply manifold 231, a system coolant return manifold 232, and manifold-to-node fluid connect hoses 233 coupling system coolant supply manifold 231 to electronic subsystems 210 (for example, to cold plates or liquid-cooled vapor condensers (not shown) disposed within the subsystems) and node-to-manifold fluid connect hoses 234 coupling the individual electronic subsystems 210 to system coolant return manifold 232. Each MCU 230 is in fluid communication with system coolant supply manifold 231 via a respective system coolant supply hose 235, and each MCU 230 is in fluid communication with system coolant return manifold 232 via a respective system coolant return hose 236.

Heat load of the electronic subsystems is transferred from the system coolant to cooler facility coolant within the MCUs 230 provided via facility coolant supply line 240 and facility coolant return line 241 disposed, in the illustrated embodiment, in the space between raised floor 145 and base floor 165.

Figure 3:
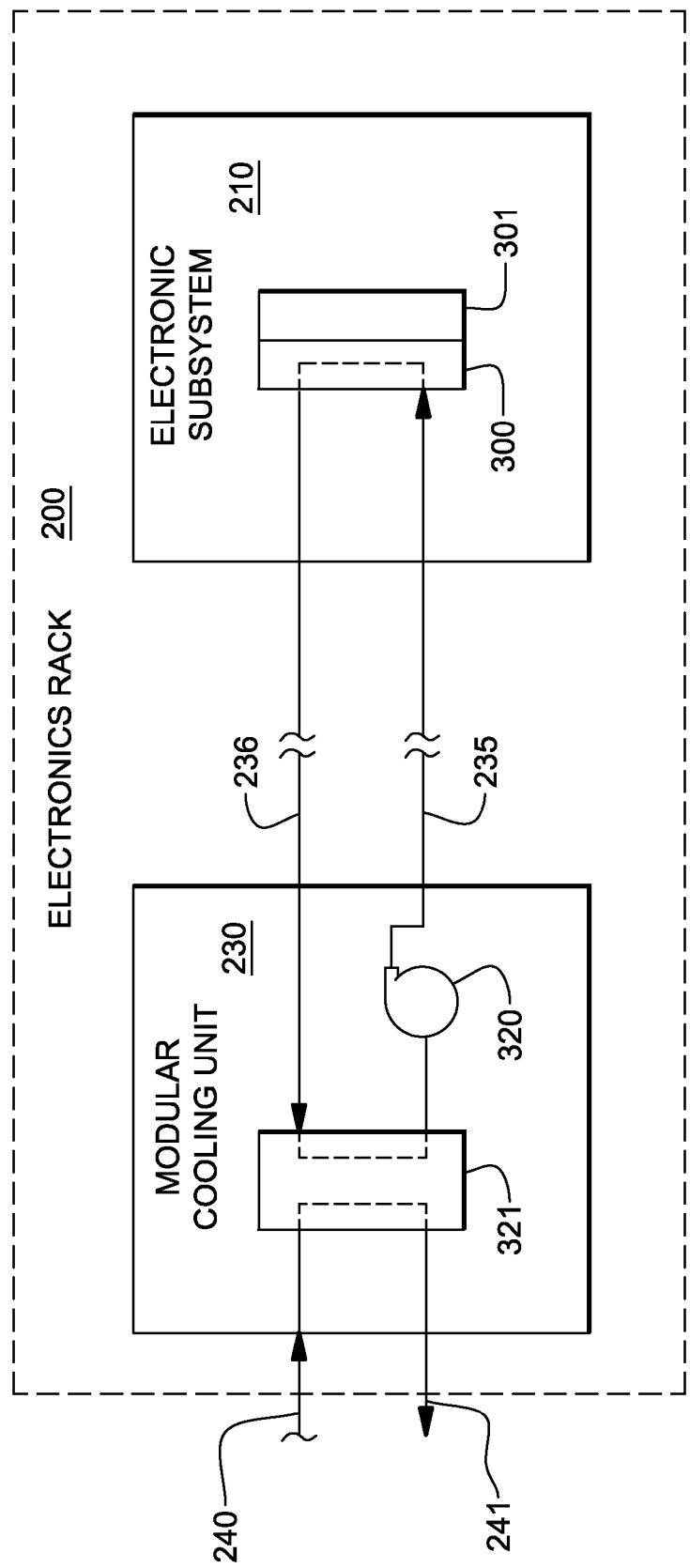
FIG. 3 is a schematic of an electronic subsystem of an electronics rack and one approach to liquid-cooling of an electronic component with the electronic subsystem, wherein the electronic component is indirectly liquid-cooled by system coolant provided by one or more modular cooling units disposed within the electronics rack, in accordance with an aspect of the present invention.

FIG. 3 schematically illustrates one cooling approach using the cooling apparatus of FIG. 2, wherein a liquid-cooled cold plate 300 is shown coupled to an electronic component 301 of an electronic subsystem 210 within the liquid-cooled electronics rack 200. Heat is removed from electronic component 301 via system coolant circulating via pump 320 through liquid-cooled cold plate 300 within the system coolant loop defined in part, by liquid-to-liquid heat exchanger 321 of modular cooling unit 230, hoses 235, 236 and cold plate 300. The system coolant loop and modular cooling unit are designed to provide coolant of a controlled temperature and pressure, as well as controlled chemistry and cleanliness to the electronic subsystems. Furthermore, the system coolant is physically separate from the less controlled facility coolant in lines 240, 241, to which heat is ultimately transferred.

Figure 4:
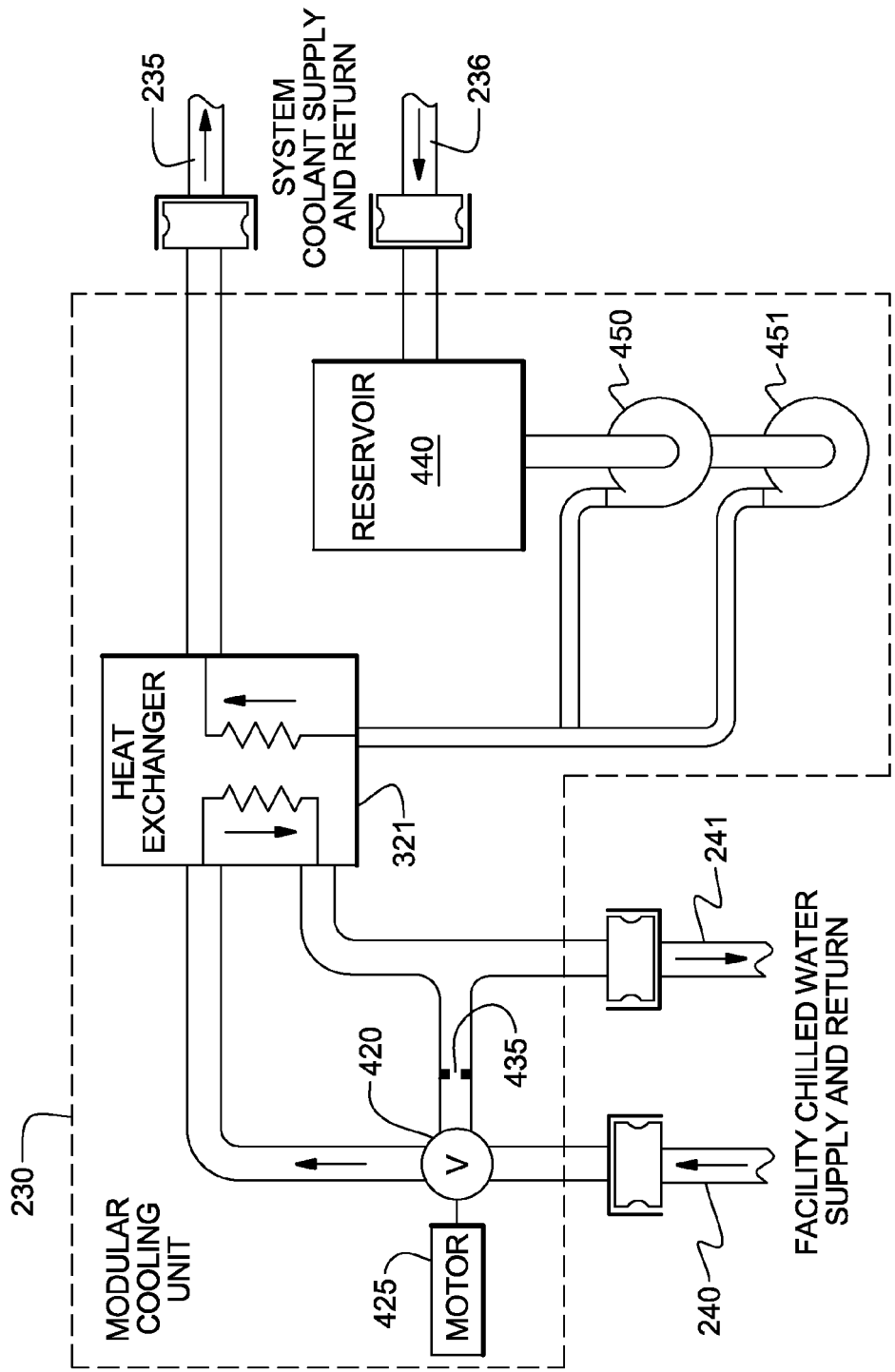
FIG. 4 is a schematic of one embodiment of a modular cooling unit for a liquid-cooled electronics rack such as illustrated in FIG. 2, in accordance with an aspect of the present invention.

FIG. 4 depicts one detailed embodiment of a modular cooling unit 230. As shown in FIG. 4, modular cooling unit 230 includes a facility coolant loop, wherein building chilled, facility coolant is provided (via lines 240, 241) and passed through a control valve 420 driven by a motor 425. Valve 420 determines an amount of facility coolant to be passed through heat exchanger 321, with a portion of the facility coolant possibly being returned directly via a bypass orifice 435. The modular cooling unit further includes a system coolant loop with a reservoir tank 440 from which system coolant is pumped, either by pump 450 or pump 451, into liquid-to-liquid heat exchanger 321 for conditioning and output thereof, as cooled system coolant to the electronics rack to be cooled. Each modular cooling unit is coupled to the system supply manifold and system return manifold of the liquid-cooled electronics rack via the system coolant supply hose 235 and system coolant return hose 236, respectively.

Figure 5:
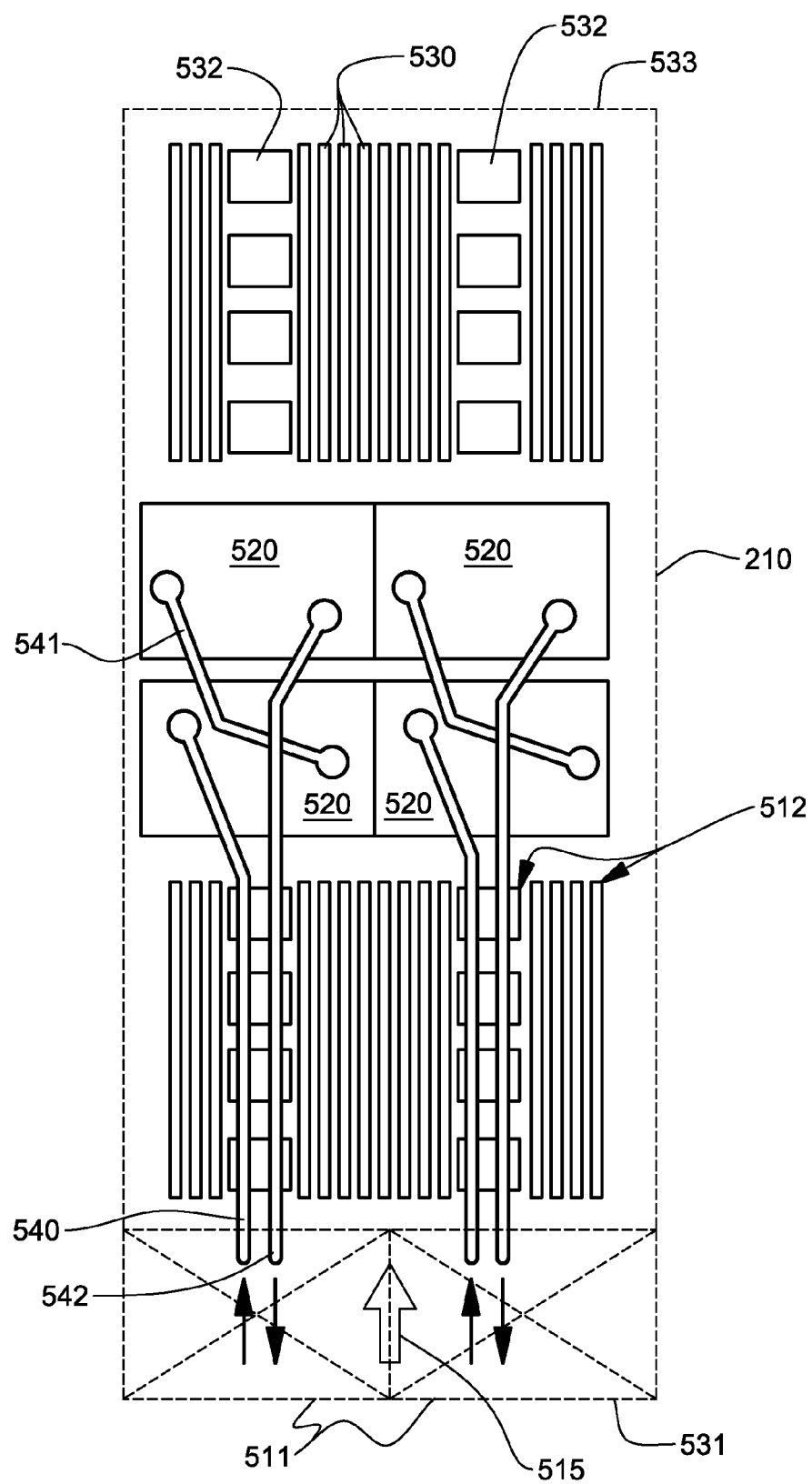
FIG. 5 is a plan view of one embodiment of an electronic subsystem layout illustrating an air and liquid cooling approach for cooling electronic components of the electronic subsystem, in accordance with an aspect of the present invention.

FIG. 5 depicts another cooling approach, illustrating one embodiment of an electronic subsystem 210 component layout wherein one or more air moving devices 511 provide forced air flow 515 in normal operating mode to cool multiple electronic components 512 within electronic subsystem 210. Cool air is taken in through a front 531 and exhausted out a back 533 of the drawer. The multiple components to be cooled include multiple processor modules to which liquid-cooled cold plates 520 are coupled, as well as multiple arrays of memory modules 530 (e.g., dual in-line memory modules (DIMMs)) and multiple rows of memory support modules 532 (e.g., DIMM control modules) to which air-cooled heat sinks may be coupled. In the embodiment illustrated, memory modules 530 and the memory support modules 532 are partially arrayed near front 531 of electronic subsystem 210, and partially arrayed near back 533 of electronic subsystem 210. Also, in the embodiment of FIG. 5, memory modules 530 and the memory support modules 532 are cooled by air flow 515 across the electronics subsystem.

The illustrated cooling apparatus further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid-coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

As a further cooling approach to a liquid-cooled electronics rack, direct immersion-cooling of electronic components of an electronic subsystem within dielectric fluid (i.e., a liquid dielectric) may be employed. Such an immersion-cooling approach advantageously avoids forced air-cooling and enables total liquid-cooling of the electronics rack within a data center. Although indirect liquid-cooling, such as described above in connection with FIGS. 3 and 5, has certain advantages due to the low cost and wide availability of water as a coolant, as well as its superior thermal and hydraulic properties, where possible and viable, the use of dielectric fluid immersion-cooling may offer several unique benefits.

For example, the use of a dielectric fluid that condenses at a temperature above typical outdoor ambient air temperature enables data center cooling architectures which do not require energy intensive refrigeration chillers. Yet other practical advantages, such as the ability to ship a coolant filled electronic subsystem, may offer benefit over water-cooled approaches such as depicted in FIGS. 3 and 5, which require shipping dry and the use of a fill and drain protocol to insure against freeze damage during transport. Also, the use of liquid immersion-cooling may, in certain cases, allow for greater compaction of electronic components at the electronic subsystem level and/or electronic rack level since conductive cooling structures might be eliminated. Unlike corrosion sensitive water-cooled systems, chemically inert dielectric coolant can be employed within an immersion-cooling approach such as described herein, would not mandate copper as the primary thermally conductive wetted metal. Lower cost and lower mass aluminum structures could replace copper structures wherever thermally viable, and the mixed wetted metal assemblies would not be vulnerable to galvanic corrosion, such as in a water based cooling approach. For at least these potential benefits, dielectric fluid immersion-cooling of one or more electronic subsystems of an electronics rack may offer significant energy efficiency and higher performance cooling benefits, compared with currently available hybrid air and water (only) cooled systems.

In the examples discussed below, the dielectric fluid or coolant may comprise any one of a variety of commercially available dielectric coolants. For example, any of the Novec™ fluids manufactured by 3M Corporation (e.g., FC-72, FC-86, HFE-7000, and HFE-7200) could be employed. Alternatively, a refrigerant such as R-134a or R-245fa may be employed if desired.

Figure 6A:
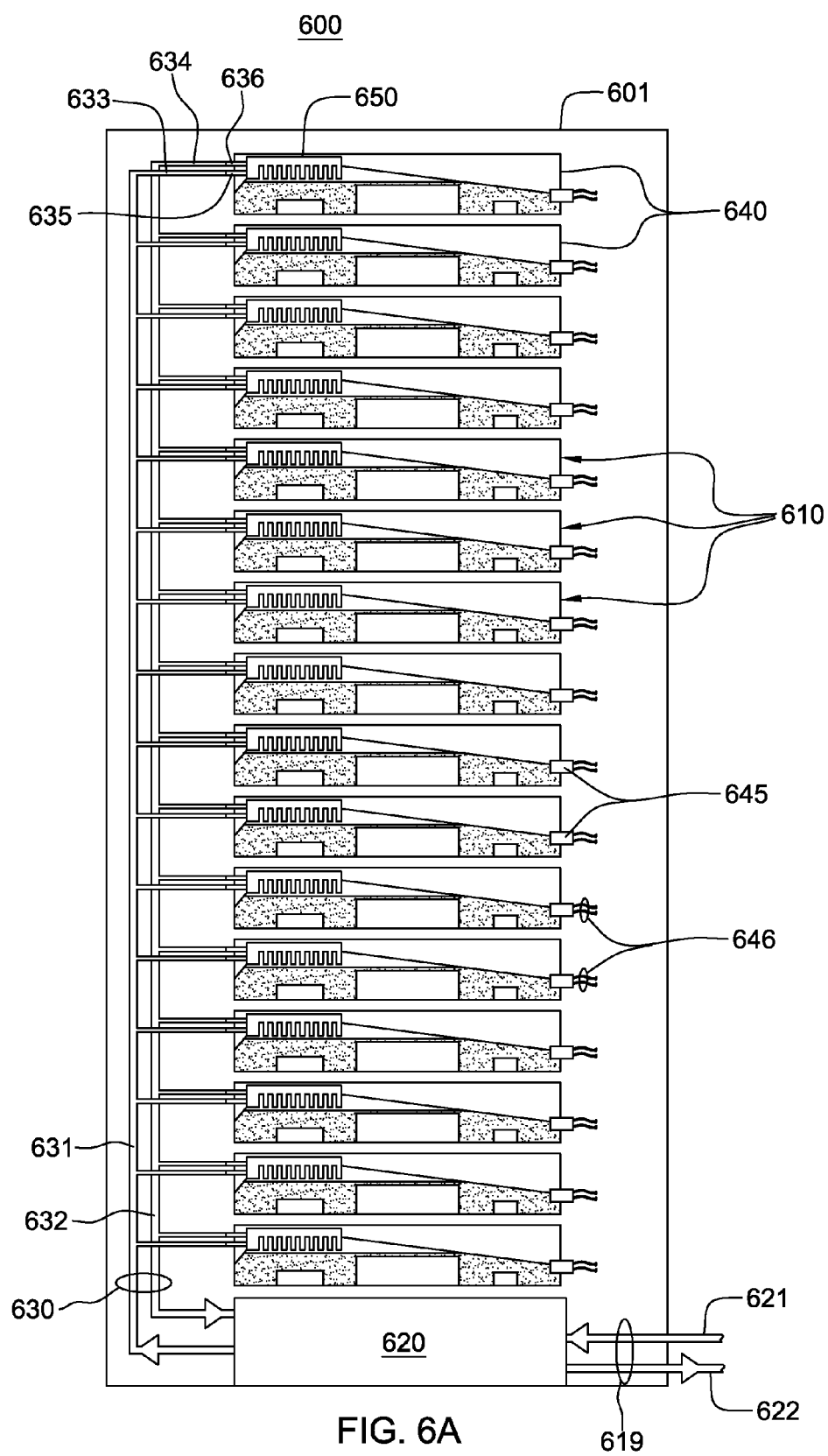
FIG. 6A is an elevational view of one embodiment of a liquid-cooled electronics rack with immersion-cooling of electronic subsystems thereof, in accordance with an aspect of the present invention.

FIG. 6A is a schematic of one embodiment of a liquid-cooled electronics rack, generally denoted 600, employing immersion-cooling of electronic subsystems, in accordance with an aspect of the present invention. As shown, liquid-cooled electronics rack 600 includes an electronics rack 601 containing a plurality of electronic subsystems 610 disposed, in the illustrated embodiment, horizontally so as to be stacked within the rack. By way of example, each electronic subsystem 610 may implement a server unit of a rack-mounted plurality of server units. In addition, each electronic subsystem includes multiple electronic components to be cooled, which in one embodiment, comprise multiple different types of electronic components having different heights and/or shapes within the electronic subsystem.

The cooling apparatus is shown to include one or more modular cooling units (MCU) 620 disposed, by way of example, in a lower portion of electronics rack 601. Each modular cooling unit 620 may be similar to the modular cooling unit depicted in FIG. 4, and described above. The modular cooling unit includes, for example, a liquid-to-liquid heat exchanger for extracting heat from coolant flowing through a system coolant loop 630 of the cooling apparatus and dissipating heat within a facility coolant loop 619, comprising a facility coolant supply line 621 and a facility coolant return line 622. As one example, facility coolant supply and return lines 621, 622 couple modular cooling unit 620 to a data center facility coolant supply and return (not shown). Modular cooling unit 620 further includes an appropriately sized reservoir, pump and optional filter for moving liquid-coolant under pressure through system coolant loop 630. In one embodiment, system coolant loop 630 includes a coolant inlet manifold 631 and a coolant outlet manifold 632, which are coupled to modular cooling unit 620 via, for example, flexible hoses and respective quick connect couplings. The flexible hoses allow the inlet and outlet manifolds to be mounted within, for example, a door of the electronics rack hingedly mounted to the front or back of the electronics rack. In one example, coolant inlet manifold 631 and coolant outlet manifold 632 each comprise an elongated rigid tube vertically mounted to the electronics rack 601 or to a door of the electronics rack.

In the embodiment illustrated, coolant inlet manifold 631 and coolant outlet manifold 632 are in fluid communication with respective coolant inlets 635 and coolant outlets 636 of individual sealed housings 640 containing the electronic subsystems 610. Fluid communication between the manifolds and the sealed housings is established, for example, via appropriately sized, flexible tubings 633, 634. As explained further below, each coolant inlet 635 and coolant outlet 636 of a sealed housing is coupled to a respective liquid-cooled vapor condenser 650 disposed within the sealed housing 640. Heat removed from the electronic subsystem 610 via the respective liquid-cooled vapor condenser 650 is transferred from the system coolant via the coolant outlet manifold 632 and modular cooling unit 620 to facility coolant loop 619. In one example, coolant passing through system coolant loop 630, and hence, coolant passing through the respective liquid-cooled vapor condensers 650 is water.

Note that, in general, fluidic coupling between the electronic subsystems and coolant manifolds, as well as between the manifolds and the modular cooling unit(s) can be established using suitable hoses, hose barb fittings and quick disconnect couplers. In the example illustrated, the vertically-oriented coolant inlet and outlet manifolds 631, 632, each include ports which facilitate fluid connection of the respective coolant inlets and outlets 635, 636 of the electronic subsystems to the manifolds via the flexible hoses 633, 634. Respective quick connect couplings may be employed to couple the flexible tubings to the coolant inlets and coolant outlets of the sealed housings to allow for, for example, removal of a housing and electronic subsystem from the electronics rack. The quick connect couplings may be any one of various types of commercial available couplings, such as those available from Colder Products Co. of St. Paul, Minn., USA or Parker Hannifin of Cleveland, Ohio, USA.

One or more hermetically sealed electrical connectors 645 may also be provided in each sealed housing 640, for example, at a back surface thereof, for docking into a corresponding electrical plane of the electronics rack in order to provide electrical and network connections 646 to the electronic subsystem disposed within the sealed housing when the electronic subsystem is operatively positioned within the sealed housing and the sealed housing is operatively positioned within the electronics rack.

Figure 6B:
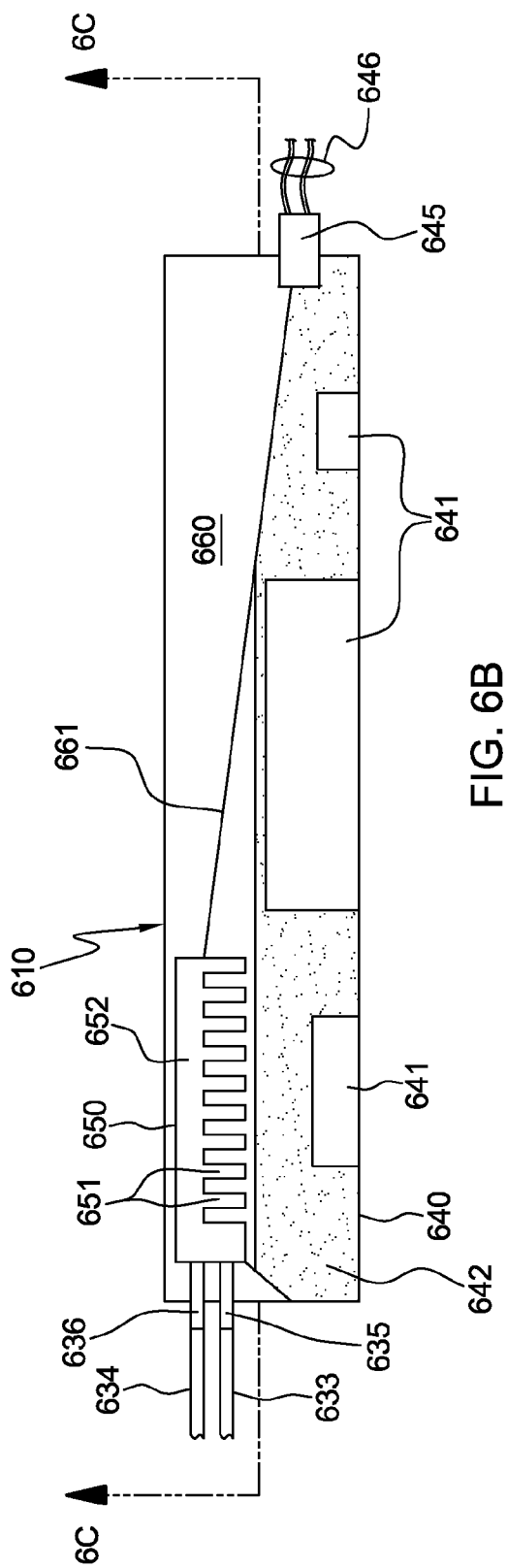
FIG. 6B is a cross-sectional elevational view of one immersion-cooled electronic subsystem of the liquid-cooled electronics rack of FIG. 6A, in accordance with an aspect of the present invention.

As illustrated in FIG. 6B, electronic subsystem 610 comprises a plurality of electronic components 641 of different height and type, and is shown within sealed housing 640 with the plurality of electronic components 641 immersed within a dielectric fluid 642. Sealed housing 640 is configured to at least partially surround and form a sealed compartment about the electronic subsystem with the plurality of electronic components 641 disposed within the sealed compartment. In an operational state, dielectric fluid 642 pools in the liquid state at the bottom of the sealed compartment and is of sufficient volume to submerge the electronic components 641. The electronic components 641 dissipate varying amounts of power, which cause the dielectric fluid to boil, releasing a dielectric fluid vapor, which rises to the upper portion of the sealed compartment of the housing.

The upper portion of sealed housing 640 is shown in FIG. 6B to include liquid-cooled vapor condenser 650 and a filler material 660. Liquid-cooled vapor condenser 650 is a thermally conductive structure which includes a liquid-cooled base plate 652 and a plurality of thermally conductive condenser fins 651 extending therefrom in the upper portion of the sealed compartment. Filler material 660, which is provided to reduce an amount of dielectric fluid required within the sealed compartment to achieve full immersion of the electronic subsystem's plurality of electronic components, includes a shaped surface 661 which is configured to direct dielectric fluid vapor rising in remote regions of the sealed compartment to the plurality of thermally conductive condenser fins 651. The dielectric fluid vapor contacts the cool surfaces of the thermally conductive condenser fins and condenses back to liquid phase, dropping downwards towards the bottom of the sealed compartment.

System coolant supplied to the coolant inlet of the housing passes through the liquid-cooled base plate of the liquid-cooled vapor condenser and cools the solid material of the condenser such that condenser fin surfaces that are exposed within the sealed compartment to the dielectric fluid vapor are well below saturation temperature of the vapor. Thus, vapor in contact with the cool condenser fin surfaces will reject heat to these surfaces and condense back to liquid form. Based on operating conditions of the liquid-cooled vapor condenser 650, the condensed liquid may be close in temperature to the vapor temperature or could be sub-cooled to a much lower temperature. Note that although depicted herein with reference to square-shaped or rectangular-shaped pin fins, the concepts presented are readily applicable to a variety of different fin configurations. For example, the condenser fins might have a circular, trapezoidal, triangular, parallelogram, part rectangular part curve, etc. transverse cross-sectional perimeter along at least a portion of their length.

As noted, the immersion-cooled electronic subsystem 610 of FIG. 6B includes filler material 660 with shaped surface 661 configured to direct dielectric coolant vapor to the liquid-cooled vapor condenser, and in particular, to the plurality of thermally conductive condenser fins. A typical 1U server unit node may have heat dissipation as low as 300 Watts, with potential for future cooling needs as high as 1000 Watts. While the requisite vapor condensation for such thermal conditions could be performed by a large condenser extending across the upper portion of the immersion-cooled electronic subsystem, for example, spanning the entire length and width of the electronic subsystem, it can be advantageous to perform this function using a "localized" high performance thermally conductive vapor condenser structure, such as illustrated in FIG. 6B. This "localized" vapor condenser structure can be located near the coolant inlet and coolant outlet of the sealed housing, or alternatively in the proximity of or aligned over the higher heat flux electronic components, such as processors within the electronic subsystem. The "localized" liquid-cooled vapor condenser illustrated advantageously has a significantly smaller footprint than the footprint of the electronic subsystem, for example, less than one-half the footprint of the electronic subsystem. This can result in significant material, cost and weight savings.

To facilitate proper functioning, the shaped surface(s) of the filler material direct all dielectric fluid vapor (generated within the immersion-cooled electronic subsystem via boiling heat transfer) towards the liquid-cooled vapor condenser 650. As one example, filler material 660 is a low weight polymeric filler material having a lower cost and lower weight than the dielectric fluid. The lighter weight and lower cost filler material also serves to reduce the weight and cost of the cooling apparatus.

Advantageously, filler material 660 is sized and configured to reduce the total volume of dielectric fluid utilized to achieve immersion-cooling of the plurality of electronic components 641 of electronic subsystem 610 within the dielectric fluid. As illustrated, filler material 660 partially resides below a level of liquid dielectric fluid within the sealed compartment in order to displace the liquid dielectric fluid, and thereby require less dielectric fluid for immersion-cooling of all electronic components within the electronic subsystem. Additionally, along with displacing of liquid dielectric fluid, the shaped surface is configured to direct dielectric coolant vapor towards the plurality of thermally conductive condenser fins.

Figure 6C:
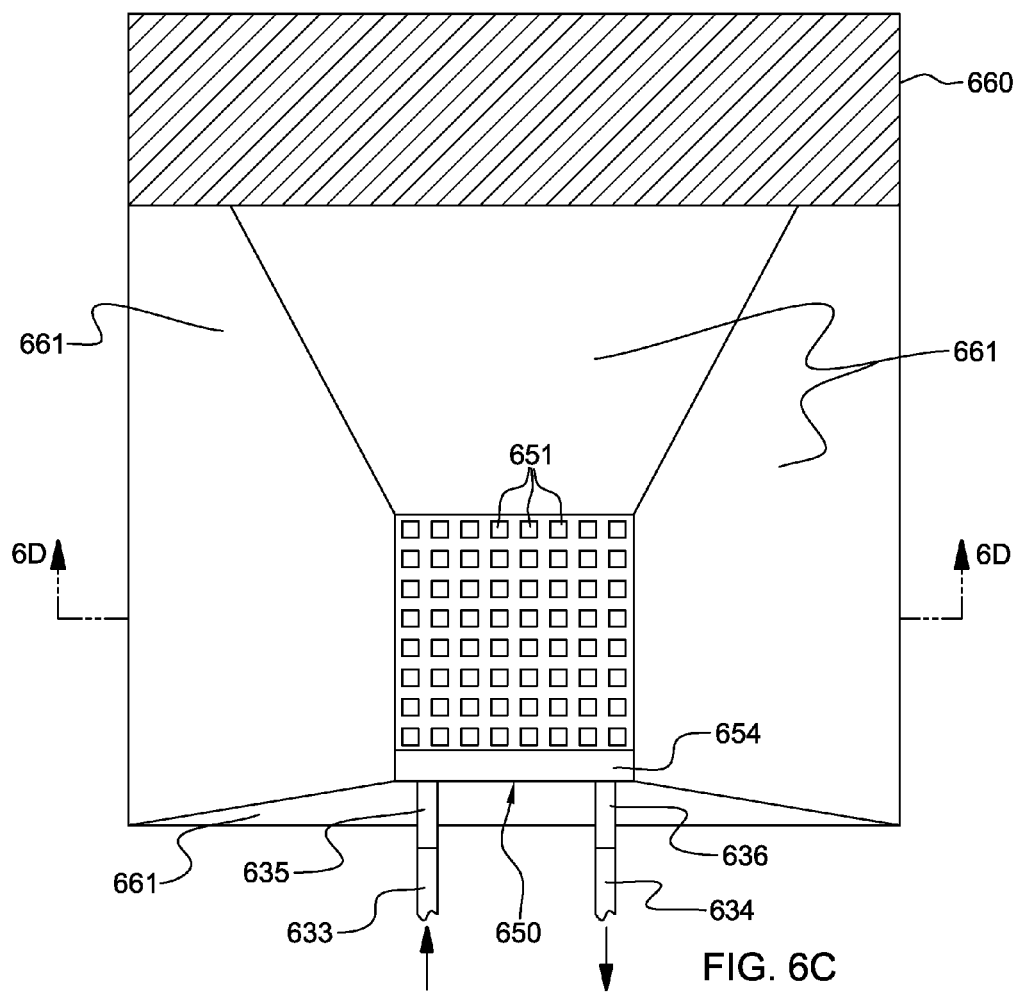
FIG. 6C is a cross-sectional plan view of the liquid-cooled vapor condenser and filler material subassembly of the immersion-cooled electronic subsystem of FIG. 6B, taken along line 6C-6C thereof, in accordance with an aspect of the present invention.
Figure 6D:
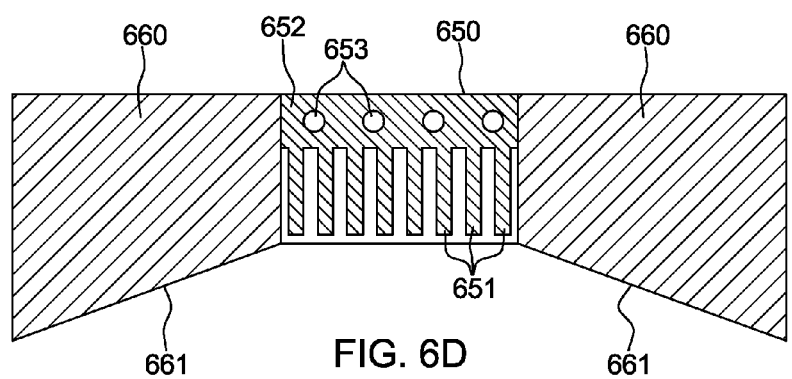
FIG. 6D is a cross-sectional elevational view of the liquid-cooled vapor condenser and filler material subassembly of the immersion-cooled electronic subsystem of FIGS. 6B-6C, taken along line 6D-6D of FIG. 6C, in accordance with an aspect of the present invention.

FIG. 6C is a cross-sectional plan view of the immersion-cooled electronic subsystem 610 of FIGS. 6A-6B, and particularly illustrating the liquid-cooled vapor condenser and filler material subassembly, with sloped surfaces 661 of the filler material converging towards the plurality of thermally conductive condenser fins 651 of liquid-cooled vapor condenser 650. FIG. 6D is a cross-sectional elevational view of the subassembly of FIG. 6C. As illustrated in these figures, liquid-cooled vapor condenser 650 includes a plenum structure 654 as part of liquid-cooled base plate 652, which facilitates passage of system coolant through one or more channels 653 within the liquid-cooled base plate 652. In operation, cooled system coolant is received via flexible hose 633 and cooling inlet 635 into plenum structure 654, and heated coolant is exhausted via coolant outlet 636 and flexible hose 634 to the coolant outlet manifold illustrated in FIG. 6A. The various sloped surface 661 portions of the filler material are shown to converge at the liquid-cooled vapor condenser, and in particular at the plurality of thermally conductive condenser fins 651. This combination of sloped and converging surfaces directs dielectric coolant vapor generated within the sealed compartment of the immersion-cooled electronic subsystem anywhere within the electronic subsystem, including positions remote from the vapor condenser, to travel towards the condenser. The dielectric fluid vapor condenses on the plurality of thermally conductive condenser fins and drops down returning to the liquid state of the dielectric fluid, which finds its own level within the immersion-cooled electronic subsystem. Any open volume that is not occupied by the filler material or the plurality of thermally conductor condenser fins is occupied by the dielectric fluid (liquid or vapor).

FIG. 7 illustrates a cross-sectional elevational view of an alternate embodiment of a liquid-cooled vapor condenser 650 and filler material 760 subassembly for an immersion-cooled electronic subsystem such as described herein. In this embodiment, the liquid-cooled vapor condenser 650 and cooling apparatus are assumed identical to those described above in connection with FIGS. 6A-6D. Except for its configuration, filler material 760 is also analogous to filler material 660 of the cooling apparatus of FIGS. 6A-6D. In the embodiment illustrated in FIG. 7, filler material 760 has a shaped surface 761 comprising a concave surface portion which provides greater clearance and an open volume in (for example) the central region of the immersion-cooled electronic subsystem. This configuration may be advantageous for an electronic subsystem with one or more taller power dissipating components located in the central region. In the embodiment of FIG. 7, note that ends 762 of filler material 760 may extend into and displace a portion of the dielectric fluid to reduce a required amount of dielectric fluid within the immersion-cooled electronic subsystem, as described above in connection with the cooling apparatus of FIG. 6A-6D. Note also with reference to FIG. 7 that shaped surface 761 could comprise other surface portions differently contoured, depending upon the location within the immersion-cooled electronic subsystem. That is, the shaped surface could have a concave surface portion, as illustrated in FIG. 7 in a region adjacent to the liquid-cooled vapor condenser 650, for example, to accommodate one or more taller electronic components of the electronic subsystem, and have an angled, planar surface shape in a different region of the electronic subsystem where, for example, lower profile electronic components may be disposed. Note that in the subsystem examples described herein, the electronic subsystem comprises a substrate or circuit board with a plurality of different types of electronic components positioned on the substrate or board and extending different heights above its surface.

Figure 8C:
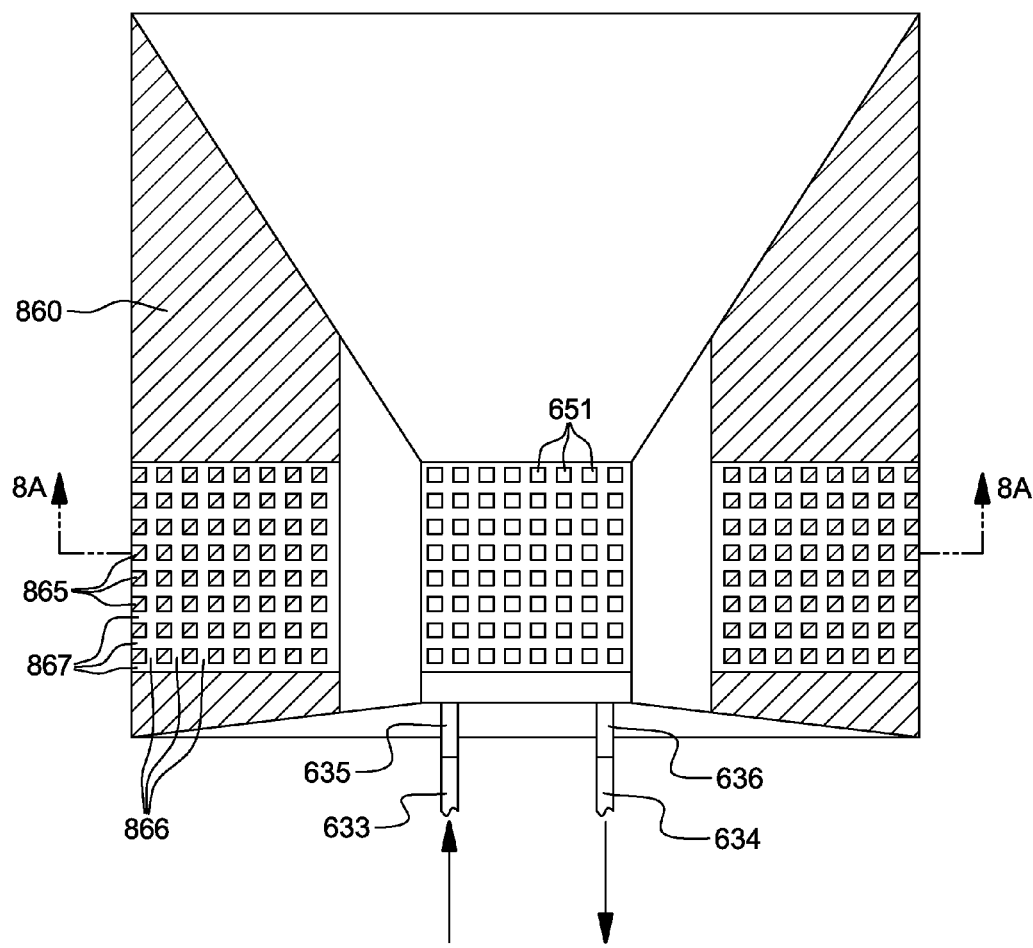
FIG. 8C is a cross-sectional plan view of the liquid-cooled vapor condenser and filler material subassembly of FIG. 8A, taken along line 8C-8C thereof, in accordance with an aspect of the present invention.

FIGS. 8A-8C depict another embodiment of a liquid-cooled vapor condenser and filler material subassembly of a cooling apparatus, in accordance with an aspect of the present invention. Referring collectively to FIGS. 8A-8C, filler material 860 is shown to surround liquid-cooled vapor condenser 650, which is assumed identical to that described above in connection with FIGS. 6A-6D. Filler material 860 includes a shaped surface 861 contoured with a partially convex profile to, for example, fill as much open volume of the sealed compartment as thermally viable, while allowing dielectric fluid vapor to reach the plurality of thermally conductive condenser fins 651. In the example of FIGS. 8A-8C, the convex portions of filler material 860 are shown to comprise a plurality of recesses 866 and a plurality of channels 867, which extend perpendicular to each other resulting in pillars 865 of filler material 860 remaining. The plurality of recesses 866 are sized and positioned to accommodate respective electronic components (not shown), such as lower power components (e.g., DIMM cards). In the examples of FIGS. 8A-8C, the plurality of recesses 866 extend parallel to each other (by way of example only), and the plurality of channels allow dielectric fluid vapor generated locally to travel towards the liquid-cooled vapor condenser fins. In one example, the plurality of channels 867 may be differently sized and spaced in comparison to the plurality of recesses, and as illustrated in FIG. 8C, may be perpendicular (or otherwise) to the plurality of recesses. Both the recesses and the channels extend into the filler material a certain distance above the height of the electronic components being accommodated within the filler material to provide space for the components and allow vapor to locally rise in the recesses, and then traverse along the channels towards the plurality of thermally conductive condenser fins 651. As illustrated in FIG. 8C, the convex surface portions of the shaped surface 861 may be combined with other shaped surface portions of the filler material, such as angled, planar surfaces which converge towards the liquid-cooled vapor condenser.

Figure 9:
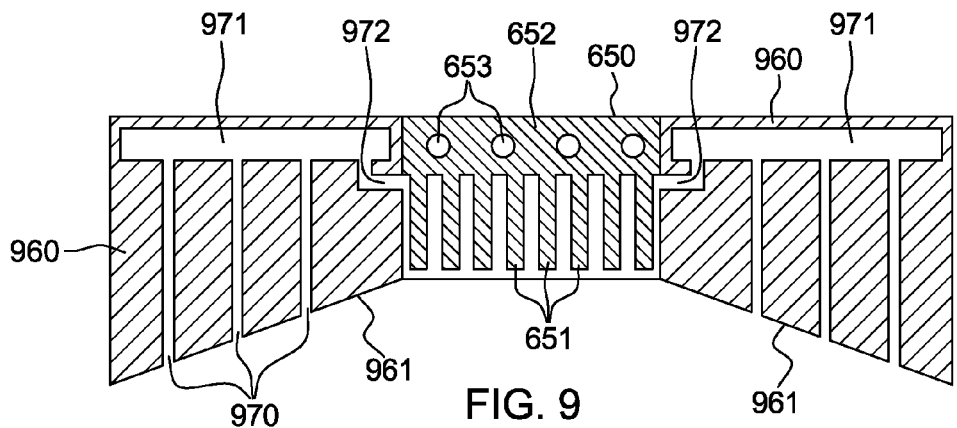
FIG. 9 is a cross-sectional elevational view of an alternate embodiment of a liquid-cooled vapor condenser and filler material subassembly of a cooling apparatus, in accordance with an aspect of the present invention.

FIG. 9 depicts a further variation of a liquid-cooled vapor condenser 650 and filler material 960 subassembly for a cooling apparatus for one or more immersion-cooled electronic subsystems, such as described herein.

At the uppermost condenser fin region of the plurality of thermally conductive condenser fins 651, adjacent to the liquid-cooled base plate 652, a thin layer of non-condensable gas (such as air) may accumulate, having come out of solution from the dielectric fluid in liquid state, and traveled upwards. This non-condensable gas can reside in solution with the dielectric fluid, but once it comes out of solution through the boiling process cannot be returned into solution via the condensation process. Such a layer of non-condensable gas is a low thermal conductivity layer, which might cover a portion of the condenser fins that would otherwise be used for vapor condensation. Thus, it is advantageous to remove this non-condensable gas layer. FIG. 9 illustrates one embodiment of a filler material 960 which addresses this need.

As shown, filler material 960 includes a sloped surface 961, which directs dielectric fluid vapor towards liquid-cooled vapor condenser 650, and a plurality of channels or passages 970, 972 that allow and direct non-condensable gases (that would otherwise accumulate at the base of the plurality of thermally conductive condenser fins) to one or more remote chambers 971 within the filler material 960. As shown, passages 972 in the filler material couple at one end to the most likely location of the non-condensable gas layer and at the other end to remote chambers 971. The remote chambers are at an elevation above the location at which the condenser fins 651 couple to the liquid-cooled base plate 652 to allow any non-condensable gas to travel via its own buoyancy to the remote chambers 971, thus allowing coolant vapor to then occupy the condenser fin region freed up by movement of the non-condensable gas.

Figure 10:
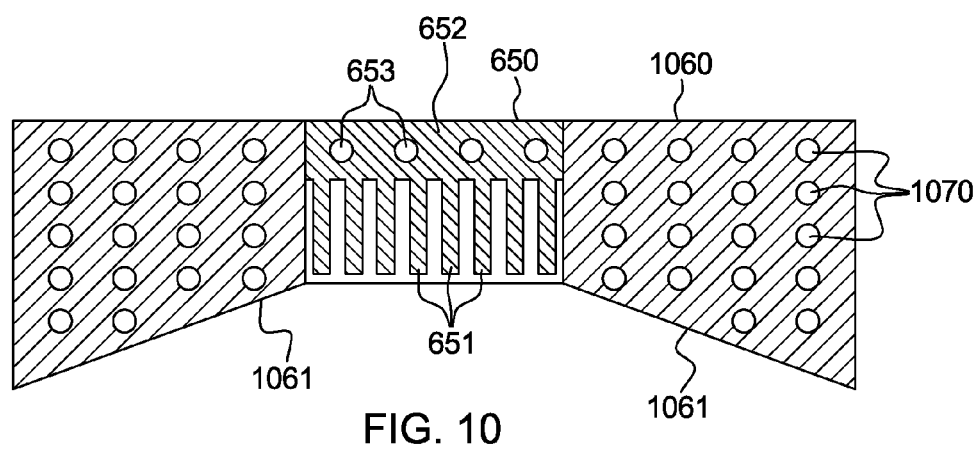
FIG. 10 is a cross-sectional elevational view of another embodiment of a liquid-cooled vapor condenser and filler material subassembly of a cooling apparatus, in accordance with an aspect of the present invention.

FIG. 10 is a cross-sectional elevational view of another embodiment of a liquid-cooled vapor condenser 650 and filler material 1060 subassembly for one or more immersion-cooled electronic subsystems. Filler material 1060 is shown to include a sloped surface 1061 which directs dielectric fluid vapor within the sealed compartment (not shown) towards the plurality of thermally conductive condenser fins 651 of liquid-cooled vapor condenser 650. The filler material 1060 is shown to include a plurality of spherical or other shaped, sealed air pockets or volumes 1070, which serve to further reduce the weight of the filler material and reduce the amount of filler material required to manufacture the immersion-cooled electronic subsystem.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling apparatus comprising:
   a housing configured to at least partially surround and form a sealed compartment about an electronic subsystem comprising a plurality of electronic components to be cooled;
   a dielectric fluid disposed within the sealed compartment, wherein the electronic subsystem's plurality of electronic components to be cooled are immersed within the dielectric fluid;
   a liquid-cooled vapor condenser, the liquid-cooled vapor condenser comprising a plurality of thermally conductive condenser fins extending within the sealed compartment in an upper portion of the sealed compartment, the plurality of thermally conductive condenser fins facilitating cooling and condensing of dielectric fluid vapor rising to the upper portion of the sealed compartment; and
   a filler material disposed within the sealed compartment and reducing an amount of dielectric fluid required within the sealed compartment to achieve immersion of the electronic subsystem's plurality of electronic components within the dielectric fluid, the filler material comprising a shaped surface, the shaped surface being configured to direct dielectric fluid vapor within the sealed compartment towards the plurality of thermally conductive condenser fins.

2. The cooling apparatus of claim 1, wherein the shaped surface of the filler material comprises at least one planar surface portion angled to direct dielectric fluid vapor within the sealed compartment towards the plurality of thermally conductive condenser fins of the liquid-cooled vapor condenser.

3. The cooling apparatus of claim 1, wherein the shaped surface of the filler material comprises at least one concave surface portion curved to direct dielectric fluid vapor within the sealed compartment towards the plurality of thermally conductive condenser fins, the at least one concave surface portion accommodating a height of one or more taller electronic components of the plurality of electronic components to be cooled.

4. The cooling apparatus of claim 1, wherein the shaped surface of the filler material comprises a convex surface portion with at least one recess therein accommodating a height of at least one electronic component of the plurality of electronic components to be cooled, and wherein the filler material further comprises at least one channel intersecting the at least one recess to direct dielectric fluid vapor within the at least one recess of the filler material towards the plurality of thermally conductive condenser fins of the liquid-cooled vapor condenser.

5. The cooling apparatus of claim 4, wherein the filler material comprises multiple parallel-extending recesses accommodating the height of multiple parallel-disposed electronic components of the plurality of electronic components of the electronic subsystem, and wherein the filler material further comprises multiple channels intersecting the multiple parallel-extending recesses to direct dielectric fluid vapor within the multiple parallel-extending recesses of the filler material towards the plurality of thermally conductive condenser fins of the liquid-cooled vapor condenser.

6. The cooling apparatus of claim 1, wherein at least a portion of the shaped surface of the filler material is covered by the dielectric fluid within the sealed compartment.

7. The cooling apparatus of claim 1, wherein the liquid-cooled vapor condenser has a footprint within the sealed compartment that is less than one-half a footprint of the electronic subsystem within the sealed compartment.

8. The cooling apparatus of claim 7, wherein the liquid-cooled vapor condenser is coupled in fluid communication with and disposed adjacent to a coolant inlet and a coolant outlet in the housing which facilitate passage of liquid coolant through the liquid-cooled vapor condenser.

9. The cooling apparatus of claim 7, wherein the liquid-cooled vapor condenser is aligned above a highest heat producing electronic component of the plurality of electronic components to be cooled of the electronic subsystem.

10. The cooling apparatus of claim 1, wherein the filler material comprises a plurality of air filled sealed volumes which reduce weight of the filler material within the sealed compartment.

11. The cooling apparatus of claim 1, wherein the filler material further comprises at least one storage volume for storing any non-condensable gas vaporizing from the dielectric fluid within the sealed compartment, the at least one storage volume being disposed within the filler material at a level of the sealed compartment at least partially above the plurality of thermally conductive condenser fins within the sealed compartment, and wherein the filler material further comprises at least one passage coupling in fluid communication a condenser fin region of the sealed compartment, within which the plurality of thermally conductive condenser fins extend, and the at least one storage volume.

12. A liquid-cooled electronics rack comprising:
an electronics rack comprising an electronic subsystem, the electronic subsystem comprising a plurality of electronic components; and
a cooling apparatus for immersion-cooling of the plurality of electronic components of the electronic subsystem, the cooling apparatus comprising:
a housing at least partially surrounding and forming a sealed compartment about the electronic subsystem comprising the plurality of electronic components;
a dielectric fluid disposed within the sealed compartment, wherein the electronic subsystem's plurality of electronic components to be cooled are immersed within the dielectric fluid;
a liquid-cooled vapor condenser, the liquid-cooled vapor condenser comprising a plurality of thermally conductive condenser fins extending within the sealed compartment in an upper portion of the sealed compartment, the plurality of thermally conductive condenser fins facilitating cooling and condensing of dielectric fluid vapor rising to the upper portion of the sealed compartment; and
a filler material disposed within the sealed compartment and reducing an amount of dielectric fluid required within the sealed compartment to achieve immersion of the electronic subsystem's plurality of electronic components within the dielectric fluid, the filler material comprising a shaped surface to direct dielectric fluid vapor within the sealed compartment towards the plurality of thermally conductive condenser fins.

13. The liquid-cooled electronics rack of claim 12, wherein the shaped surface of the filler material comprises at least one planar surface portioned angled to direct dielectric fluid vapor within the sealed compartment towards the plurality of thermally conductive condenser fins of the liquid-cooled vapor condenser.

14. The liquid-cooled electronics rack of claim 12, wherein the shaped surface of the filler material comprises at least one concave surface portion curved to direct dielectric fluid vapor within the sealed compartment towards the plurality of thermally conductive condenser fins, the at least one concave surface portion accommodating a height of one or more taller electronic components of the plurality of electronic components of the electronic subsystem.

15. The liquid-cooled electronics rack of claim 12, wherein the shaped surface of the filler material comprises a convex surface portion with at least one recess therein accommodating a height of at least one electronic component of the plurality of electronic components of the electronic subsystem, and wherein the filler material further comprises at least one channel intersecting the at least one recess to direct dielectric fluid vapor within the at least one recess of the filler material towards the plurality of thermally conductive condenser fins of the liquid-cooled vapor condenser.

16. The liquid-cooled electronics rack of claim 12, wherein the liquid-cooled vapor condenser has a footprint within the sealed compartment that is less than one-half a footprint of the electronic subsystem within the sealed compartment, and wherein at least a portion of the shaped surface of the filler material is covered by the dielectric fluid within the sealed compartment.

17. The liquid-cooled electronics rack of claim 16, wherein the liquid-cooled vapor condenser is coupled in fluid communication with and disposed adjacent to a coolant inlet and a coolant outlet in the housing which facilitate passage of liquid coolant through the liquid-cooled vapor condenser.

18. The liquid-cooled electronics rack of claim 16, wherein the liquid-cooled vapor condenser is aligned above a highest heat producing electronic component of the plurality of electronic components of the electronic subsystem.

19. The liquid-cooled electronics rack of claim 12, wherein the filler material further comprises at least one storage volume for storing any non-condensable gas vaporizing from the dielectric fluid within the sealed compartment, the at least one storage volume being disposed within the filler material at a level of the sealed compartment at least partially above the plurality of thermally conductive condenser fins within the sealed compartment, and wherein the filler material further comprises at least one passage coupling in fluid communication a condenser fin region of the sealed compartment, within which the plurality of thermally conductive condenser fins extend, and the at least one storage volume.

20. A method of facilitating cooling of an electronic subsystem, the method comprising:
- providing a housing at least partially surrounding and forming a sealed compartment about the electronic subsystem, the electronic subsystem comprising a plurality of electronic components to be cooled;
- immersing the electronic subsystem's plurality of electronic components in a dielectric fluid within the sealed compartment;
- providing a liquid-cooled vapor condenser comprising a plurality of thermally conductive condenser fins extending within the sealed compartment in an upper portion of the sealed compartment, the plurality of thermally conductive condenser fins facilitating cooling and condensing of dielectric fluid vapor rising to the upper portion of the sealed compartment; and
- disposing a filler material within the sealed compartment to reduce an amount of dielectric fluid required within the sealed compartment to achieve immersion of the electronic subsystem's plurality of electronic components within the dielectric fluid, the filler material comprising a shaped surface, the shaped surface being configured to direct dielectric fluid vapor within the sealed compartment towards the plurality of thermally conductive condenser fins, wherein at least a portion of the shaped surface of the filler material is covered by the dielectric fluid within the sealed compartment.

* * * * *